(12) United States Patent
Lee

(10) Patent No.: US 9,672,932 B2
(45) Date of Patent: Jun. 6, 2017

(54) NONVOLATILE MEMORY DEVICE AND MEMORY SYSTEM INCLUDING THE SAME

(71) Applicant: Samsung Electronics Co., Ltd., Suwon-si, Gyeonggi-do (KR)

(72) Inventor: Chang-Hyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/094,089

(22) Filed: Apr. 8, 2016

(65) Prior Publication Data

US 2016/0336075 A1    Nov. 17, 2016

(30) Foreign Application Priority Data

May 13, 2015    (KR) .................. 10-2015-0066529

(51) Int. Cl.
| | |
|---|---|
| *G11C 16/06* | (2006.01) |
| *G11C 16/34* | (2006.01) |
| *G11C 16/14* | (2006.01) |
| *G11C 16/10* | (2006.01) |
| *G11C 16/26* | (2006.01) |
| *G11C 16/04* | (2006.01) |
| *G11C 11/56* | (2006.01) |

(52) U.S. Cl.
CPC ...... *G11C 16/3445* (2013.01); *G11C 16/0483* (2013.01); *G11C 16/10* (2013.01); *G11C 16/14* (2013.01); *G11C 16/26* (2013.01); *G11C 16/344* (2013.01); *G11C 16/3454* (2013.01); *G11C 11/5628* (2013.01)

(58) Field of Classification Search
CPC ..... G11C 16/3454; G11C 16/10; G11C 16/26; G11C 16/344; G11C 11/5628
USPC ...................................... 365/185.22
See application file for complete search history.

(56) References Cited

U.S. PATENT DOCUMENTS

| | | | |
|---|---|---|---|
| 7,460,403 B2 * | 12/2008 | Lee | G11C 16/3418 365/185.17 |
| 7,679,133 B2 | 3/2010 | Son et al. | |
| 7,924,622 B2 * | 4/2011 | Lee | G11C 16/0483 365/185.17 |
| 8,488,382 B1 | 7/2013 | Li et al. | |
| 8,553,466 B2 | 10/2013 | Han et al. | |
| 8,559,235 B2 | 10/2013 | Yoon et al. | |
| 8,582,372 B2 | 11/2013 | Kim | |
| 8,654,587 B2 | 2/2014 | Yoon et al. | |
| 8,842,472 B2 | 9/2014 | Kim | |

(Continued)

FOREIGN PATENT DOCUMENTS

| | | |
|---|---|---|
| JP | 4897009 B2 | 3/2012 |
| JP | 2012-523649 A | 10/2012 |

(Continued)

*Primary Examiner* — Pho M Luu
(74) *Attorney, Agent, or Firm* — Harness, Dickey & Pierce, P.L.C.

(57) ABSTRACT

A nonvolatile memory device includes a memory cell array and a voltage generator. The memory cell array includes a plurality of planes, and each plane receives one of a first ground selection voltage and a second ground selection voltage. The voltage generator is configured to provide selectively one of the first ground selection voltage and the second ground selection voltage independently to each of the planes based on a result of an erase verification operation on each of the plurality of planes.

20 Claims, 16 Drawing Sheets

(56) References Cited

U.S. PATENT DOCUMENTS

| | | |
|---|---|---|
| 8,861,280 B2 | 10/2014 | Costa et al. |
| 8,885,412 B2 | 11/2014 | Li et al. |
| 8,897,068 B2 * | 11/2014 | Kim .................. G11C 16/0483 365/185.11 |
| 8,923,056 B2 * | 12/2014 | Kim ...................... G11C 16/26 365/185.11 |
| 9,355,733 B2 * | 5/2016 | Kim .................... G11C 11/5628 |
| 2008/0055979 A1 | 3/2008 | Shim |
| 2008/0123436 A1 | 5/2008 | Byeon |
| 2008/0247240 A1 | 10/2008 | Lee |
| 2010/0244119 A1 | 9/2010 | Fukuzumi et al. |
| 2010/0259962 A1 | 10/2010 | Yan et al. |
| 2010/0327323 A1 | 12/2010 | Choi |
| 2011/0233648 A1 | 9/2011 | Seol et al. |
| 2013/0201760 A1 | 8/2013 | Dong et al. |
| 2014/0169093 A1 | 6/2014 | Parat et al. |
| 2014/0192594 A1 | 7/2014 | Lue |
| 2014/0254263 A1 | 9/2014 | Avila et al. |
| 2014/0264525 A1 | 9/2014 | Takahashi et al. |

FOREIGN PATENT DOCUMENTS

| | | |
|---|---|---|
| KR | 2008-0022496 A | 3/2008 |
| KR | 10-0826653 B | 4/2008 |
| KR | 2008-0090801 A | 10/2008 |
| KR | 10-0888616 B | 3/2009 |
| KR | 1028993 B1 | 1/2011 |
| KR | 10-1172690 B | 8/2012 |
| KR | 2014-0120366 A | 10/2014 |
| KR | 10-1460826 B | 11/2014 |

* cited by examiner

NONVOLATILE MEMORY DEVICE AND MEMORY SYSTEM INCLUDING THE SAME

CROSS-REFERENCE TO RELATED APPLICATION

This application claims priority under 35 USC §119 to Korean Patent Applications No. 10-2015-0066529, filed on May 13, 2015 in the Korean Intellectual Property Office (KIPO), the contents of which are herein incorporated by reference in their entirety.

BACKGROUND

1. Technical Field

Example embodiments relate generally to a semiconductor device and more particularly to a nonvolatile memory device and a memory system including the nonvolatile memory device.

2. Description of Related Art

According to development of electronic devices, a memory device is being developed to have higher performance and higher speed. For higher performance and higher speed, various researches are in progress.

SUMMARY

Some example embodiments provide a nonvolatile memory device capable of enhancing performance.

Some example embodiments provide a memory system including the nonvolatile memory device.

According to example embodiments, a nonvolatile memory device includes a memory cell array and a voltage generator. The memory cell array includes a plurality of planes, and each plane is configured to receive one of a first ground selection voltage and a second ground selection voltage. The voltage generator is configured to provide selectively one of the first ground selection voltage and the second ground selection voltage independently to each of the plurality of planes based on a result of an erase verification operation on each of the plurality of planes.

In example embodiments, the voltage generator may apply the first ground selection voltage to at least one erase completion plane of the plurality of planes based on the result of the erase verification operation. The voltage generator may apply the second ground selection voltage to at least one erase non-completion plane of the plurality of planes based on the result of the erase verification operation. The at least one erase completion plane may a plane that passes the erase verification operation. The at least one erase non-completion plane may be a plane that does not pass the erase verification operation.

In example embodiments, the first ground selection voltage may be greater than the second ground selection voltage.

In example embodiments, the voltage generator may be configured to provide the first ground selection voltage to the at least one erase completion plane until a first time when an erase voltage is provided to the memory cell array.

In example embodiments, the voltage generator may be configured to provide the one of the first ground selection voltage and the second ground selection voltage independently to each of the planes through a ground selection line connected to a floating transistor. The floating transistor may be configured to be turned on in response to a floating signal. The floating transistor may be configured to be turned off at the first time.

In example embodiments, the ground selection line may be configured to float when the floating transistor is turned off after the first time.

In example embodiments, the voltage generator may be configured to provide the second ground selection voltage to the at least one erase non-completion plane using a ground selection line until a first time when an erase voltage is provided to the memory cell array. The ground voltage selection line may be configured to float after the first time.

In example embodiments, the voltage generator may be configured to provide the first ground selection voltage to the at least one erase completion plane using a ground selection line from a first time when an erase voltage is provided to the memory cell array to a second time after the first time. The ground selection line may be configured to float after the second time.

In example embodiments, the voltage generator may be configured to provide the second ground selection voltage to the at least one erase non-completion plane using a ground selection line from a first time when an erase voltage is provided to the memory cell array to a second time after the first time. The ground selection line may be configured to float after the second time.

In example embodiments, each plane may include at least one NAND string. Each NAND string may include a string selection transistor, a ground selection transistor connected to a ground selection line, and a plurality of cell transistors connected in series between the string selection transistor and the ground selection transistor. The NAND string may further include a dummy transistor connected between a first cell transistor of the cell transistors and the ground selection transistor. The voltage generator may be configured to selectively provide a dummy gate voltage to a gate of the dummy transistor based on the result of the erase verification operation.

In example embodiments, the voltage generator may be configured to apply a first dummy gate voltage to at least one erase completion plane of the plurality of planes based on the result of the erase verification operation. The voltage generator may be configured to apply a second dummy gate voltage to at least one erase non-completion plane of the plurality of planes based on the result of the erase verification operation. The at least one erase completion plane may be a plane that passes the erase verification operation, and the at least one erase non-completion plane may be a plane that does not pass the erase verification operation.

In example embodiments, the voltage generator may be configured to provide the first dummy gate voltage to the at least one erase completion plane using a dummy gate line until a first time when an erase voltage is provided to the memory cell array. The dummy gate line may be configured to float after the first time.

In example embodiments, the voltage generator maybe configured to provide the second dummy gate voltage to the at least one erase non-completion plane using a dummy gate line until a first time when an erase voltage is provided to the memory cell array. The dummy gate line may be configured to float after the first time.

In example embodiments, the memory cell array may include a three dimensional memory cell array.

According to example embodiments, a nonvolatile memory device includes a memory cell array, a control circuit, and a voltage generator. The memory cell array includes a plurality of planes, and each plane is configured to receive one of a first ground selection voltage and a second ground selection voltage. The control circuit is configured to provide a result of an erase verification operation on each of the plurality of planes after performing the erase verification operation on each of the plurality of planes. The voltage generator is configured to provide selectively one of the first ground selection voltage and the second ground selection voltage independently to each of the plurality of planes based on a result of the erase verification operation on the plurality of planes. The voltage generator is configured to apply the first ground selection voltage to at least one erase completion plane of the plurality of planes based on the result of the erase verification operation. The voltage generator is configured to apply the second ground selection voltage to at least one erase non-completion plane of the plurality of planes based on the result of the erase verification operation. The at least one erase completion plane is a plane that passes the erase verification operation. The at least one erase non-completion plane is a plane that does not pass the erase verification operation.

In example embodiments, the volatile memory device may be configured to selectively provide one of the first ground selection voltage and the second ground selection voltage to each of planes based on a result of erase verification operation on each plane.

According to example embodiments, a nonvolatile memory device includes a memory block and a voltage generator. The memory block includes planes. The voltage generator is connected to the memory block through ground selection lines. The voltage generator is configured to receive a result of an erase verification operation performed on the planes. The voltage generator is configured to independently apply a first ground selection voltage to a first number of the planes and to apply a second ground selection voltage to a second number of the planes using the ground selections lines during an erase operation performed on the memory block, based on the result of the erase verification operation. A sum of the first number and the second number may correspond to a total number of the planes in the memory block. The first ground selection voltage may be different than the second ground selection voltage.

In example embodiments, the first number of the planes may be the planes that pass the erase verification operation. The second number of the planes may be the planes that do not pass the erase verification operation. The first ground selection voltage may be greater than the second ground selection voltage.

In example embodiments, floating transistors may be connected to the ground selection lines. The voltage generator may be configured to apply the first voltage to the first number of planes and to apply the second voltage to the second number of planes until a first time during the erase operation if the floating transistors are turned on until the first time. The voltage generator may be configured to float the ground selection lines connected to the planes if the floating transistors connected to the ground selection lines are turned off during the erase operation.

In example embodiments, each of the planes may include NAND strings. The NAND strings may include a plurality of cell transistors stacked on top of each other between a ground selection transistor and a string selection transistor. The NAND strings in the first number of planes may be erase-inhibited during the erase operation.

In example embodiments, the NAND strings may include a dummy transistor connected the cell transistors and ground selection transistor. The voltage generator may be connected to the dummy transistors through dummy gate lines. The voltage generator may be configured to apply a first dummy gate voltage to the dummy transistors in the first number of planes and to apply a dummy gate voltage to the dummy transistors in the second number of the planes using the dummy gate lines until a first time during the erase operation.

BRIEF DESCRIPTION OF THE DRAWINGS

Illustrative, non-limiting example embodiments will be more clearly understood from the following detailed description taken in conjunction with the accompanying drawings in which like reference characters refer to like parts throughout the different views. The drawings are not necessarily to scale, emphasis instead being placed upon illustrating principles of inventive concepts. In the drawings.

DETAILED DESCRIPTION OF THE EMBODIMENTS

Figure 1:
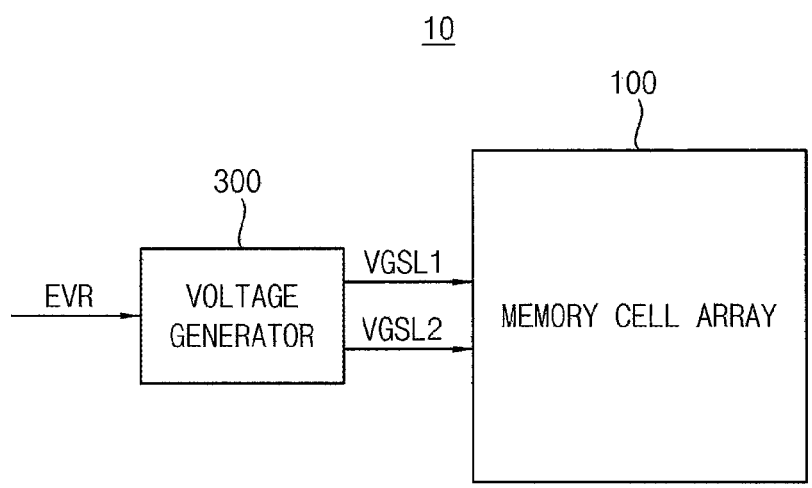
FIG. 1 is a block diagram illustrating a nonvolatile memory device according to example embodiments.

Various example embodiments will be described more fully hereinafter with reference to the accompanying drawings, in which some example embodiments are shown. Example embodiments of inventive concepts may, however, be embodied in many different forms and should not be construed as limited to the example embodiments set forth herein. Rather, these example embodiments are provided so that this disclosure will be thorough and complete, and will fully convey the scope of example embodiments of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
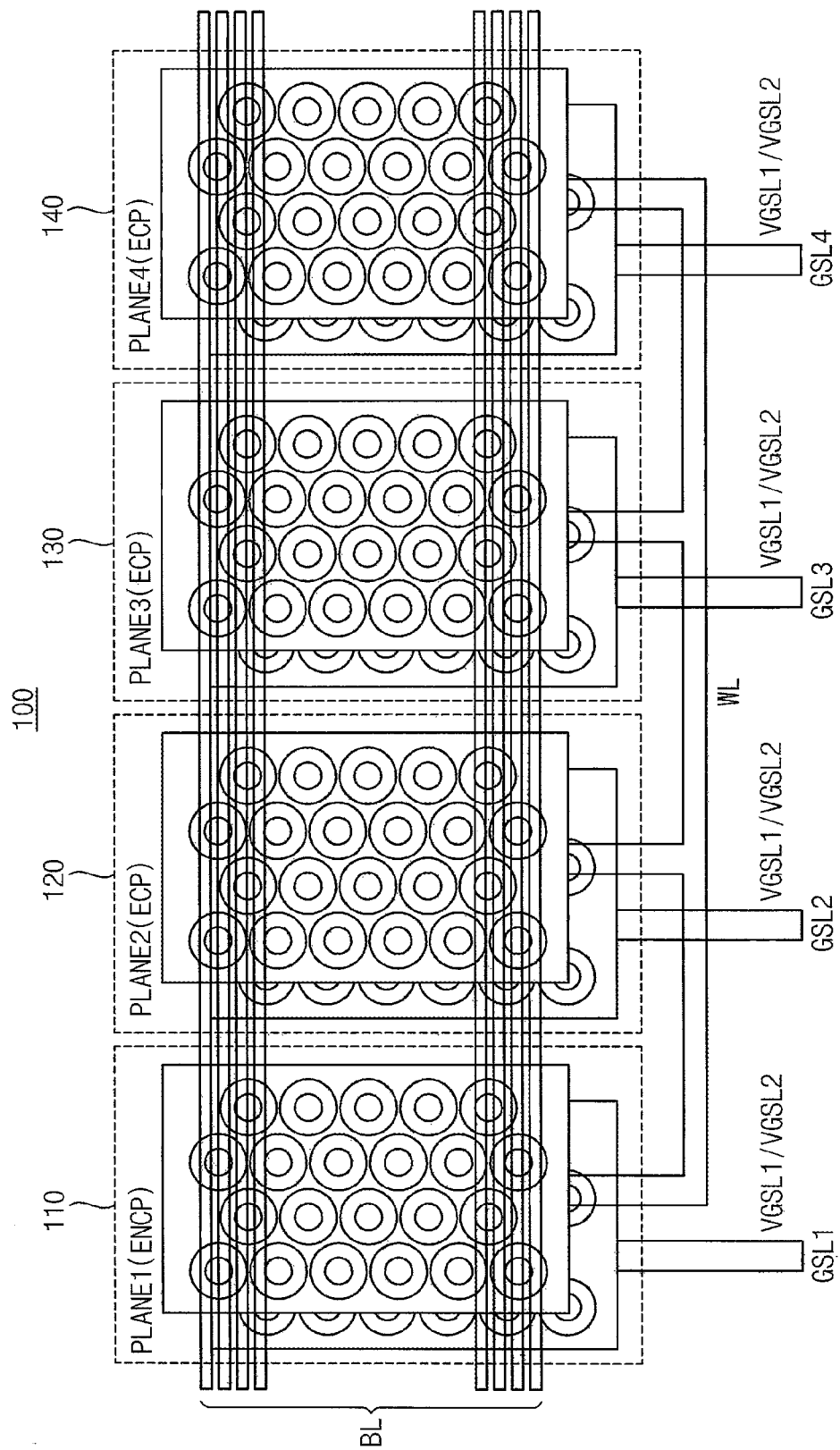
FIG. 2 illustrates an example of the memory cell array in the nonvolatile memory device of FIG. 1.

FIG. 1 is a block diagram illustrating a nonvolatile memory device according to example embodiments. FIG. 2 illustrates an example of the memory cell array in the nonvolatile memory device of FIG. 1.

Referring to FIGS. 1 and 2, a nonvolatile memory device 10 includes a memory cell array 100 and a voltage generator 300.

The memory cell array 100 includes a plurality of memory cells that are coupled to a plurality of word lines WL and a plurality of bit lines BL. The memory cell array 100 includes a plurality of planes 110~140, and each of the planes 110~140 receives a corresponding ground selection voltage VGSL. For example, the memory cell array 100 may include first to fourth planes 110~140. One memory block, unit of an erase operation of the nonvolatile memory device 10 may include at least one of the first to fourth planes 110~140. Each of first to fourth planes 110~140 may share a bit line BL. The first plane 110 may receive the ground selection voltage VGSL through a first ground selection line GSL1. In addition, the second plane 120 may receive the ground selection voltage VGSL through a second ground selection line GSL2. In addition, the third plane 130 may receive the ground selection voltage VGSL through a third ground selection line GSL3. The fourth plane 140 may receive the ground selection voltage VGSL through a fourth ground selection line GSL4.

The voltage generator 300 selectively provides one of a first ground selection voltage VGSL1 and a second ground selection voltage VGSL2 as the ground selection voltage to each of the planes 110~140 based on an erase verification result EVR (or result of an erase verification operation on each of the planes 110~140). The nonvolatile memory device 10 may perform the erase operation to erase data of the memory cells included in the first to fourth planes 110~140. After the nonvolatile memory device 10 perform the erase operation, the nonvolatile memory device 10 may perform the erase verification operation to determine whether the data of the memory cells included in the first to fourth planes 110~140 is completely erased or not. When the nonvolatile memory device 10 performs the erase verification operation, the nonvolatile memory device 10 may generate the erase verification result EVR for the first to fourth planes 110~140.

For example, when the data of the memory cells included in the first plane 110 is not completely erased, the erase verification result EVR for the first plane 110 may be not successful. In case the data of the memory cells included in the second plane 120 is completely erased, the erase verification result EVR for the second plane 120 may be successful. For example, when the erase verification result EVR for the first plane 110 may not be successful, the erase verification result EVR for the second plane 120 may be successful, the erase verification result EVR for the third plane 130 may be successful and the erase verification result EVR for the fourth plane 140 may be successful, the first plane 110 may be non erase-completion plane ENCP that does not pass the erase verification operation. In addition, the second through fourth planes 120, 130 and 140 may be erase-completion plane ECP that passes the erase verification operation.

When the erase verification result EVR for the first plane 110 is not successful, the erase verification result EVR for the second plane 120 is successful, the erase verification result EVR for the third plane 130 is successful and the erase verification result EVR for the fourth plane 140 is successful, the nonvolatile memory device 10 may perform the erase operation on the first plane 110 again and the nonvolatile memory device 10 may not perform the erase operation on the second through fourth planes 120, 130 and 140 again. As will be described in FIGS. 3 and 6, when the nonvolatile memory device 10 performs the erase operation for the first plane 110 again, the voltage generator 300 provides the second ground selection voltage VGSL2 to the first plane 110. When the nonvolatile memory device 10 does not perform the erase operation on the second through fourth planes 120, 130 and 140 again, the voltage generator 300 provides the first ground selection voltage VGSL1 to each of the second through fourth planes 120, 130 and 140.

The nonvolatile memory device 10 may enhance a performance by selectively providing one of the first ground selection voltage VGSL1 and the second ground selection voltage VGSL2 to each of the planes 110~140 based on the erase verification result EVR to decrease erase distribution.

Figure 3:
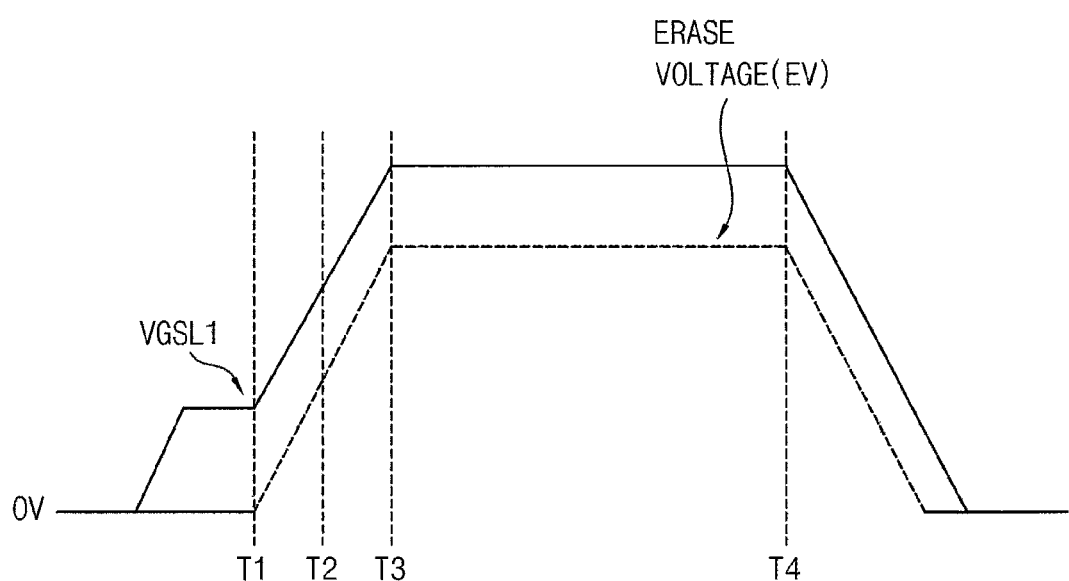
FIG. 3 is a diagram for explaining a first ground selection voltage that is provided to the nonvolatile memory device of FIG. 1.
Figure 4:
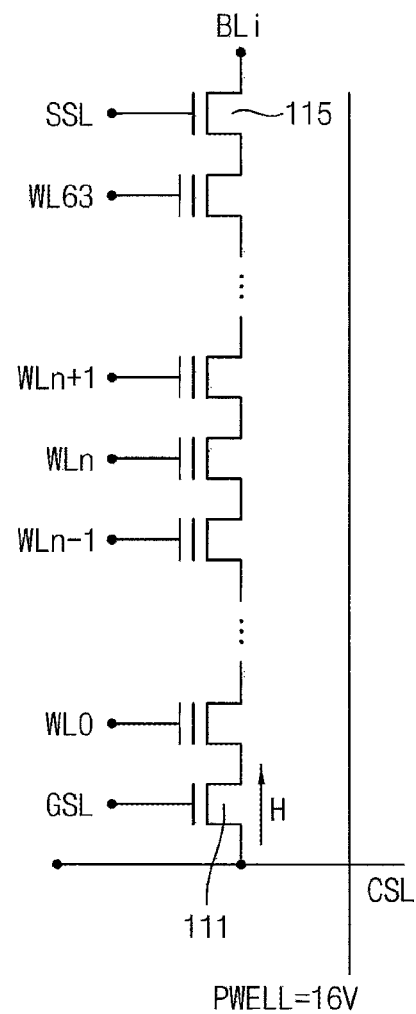
FIG. 4 is a diagram for explaining a plane in the memory cell array of FIG. 2.

FIG. 3 is a diagram for explaining a first ground selection voltage that is provided to the nonvolatile memory device of FIG. 1 and FIG. 4 is a diagram for explaining a plane in the memory cell array of FIG. 2.

Referring to FIG. 4, one of the planes 110~140 may include at least one NAND string. The NAND string includes a plurality of cell transistors connected in series between a string selection transistor 115 and a ground selection transistor 111. The ground selection transistor 111 is coupled to a common source line CSL and a gate of the ground selection transistor 111 is coupled to a ground selection line GSL. The string selection transistor 115 is coupled to a bit line BLi. Gate of the string selection transistor 115 is coupled to a string selection line SSL. The NAND string includes a plurality of cell transistors coupled to a plurality of word lines WL0~WL63.

Referring to FIGS. 3 and 4, the voltage generator 300 provides the first ground selection voltage VGSL1 to at least one erase-completion plane ECP based on the erase verification result. The voltage generator 300 provides the second ground selection voltage VGSL2 to at least one erase non-completion plane ENCP based on the erase verification result EVR. The first ground selection voltage VGSL1 may be greater than the second ground selection voltage VGSL2. When the erase verification result EVR for the first plane 110 is not successful, the erase verification result EVR for the second plane 120 is successful, the erase verification result EVR for the third plane 130 is successful and the erase verification result EVR for the fourth plane 140 is successful, the voltage generator 300 provides the second ground selection voltage VGSL2 to the first plane 110 and provides the first ground selection voltage VGSL1 to each of the second through fourth planes 120, 130 and 140.

The voltage generator 300 provides the first ground selection voltage VGSL1 to the erase-completion plane ECP until a first time T1 when an erase voltage EV is provided to the memory cell array 100. For example, the erase voltage EV may be 0V before the first time T1. The erase voltage EV may be increased after the first time T1. The erase voltage EV may be 16V between the third time T3 and the fourth time T4. The erase voltage EV may be decreased after the fourth time T4. For example, the second plane 120, the third plane 130 and the fourth plane 140 may be the erase-completion plane ECP. When the first ground selection voltage VGSL1 is provided to the second plane 120, the third plane 130 and the fourth plane 140, the ground selection transistor 111 may be turned-on. In case the ground selection transistor 111 is turned-on, though 16V is applied to the P-well line PWELL, the hole H may not be transferred through the channel between a source of the ground selection transistor 111 and a drain of the ground selection transistor 111. When the hole is not transferred through the channel between the source of the ground selection transistor 111 and the drain of the ground selection transistor 111, the erase operation may not be performed. When the first ground selection voltage VGSL1 is provided to the second plane 120, the third plane 130 and the fourth plane 140 until the first time T1, the erase operation for the second plane 120, the third plane 130 and the fourth plane 140 may not be performed. Therefore, while the erase operation on the first plane 110 is performed, the erase operation on the second plane 120, the third plane 130 and the fourth plane 140 may not be performed. The nonvolatile memory device 10 selectively performs the erase operation on the planes 110~140 by selectively providing one of the first ground selection voltage VGSL1 and a second ground selection voltage VGSL2 based on the erase verification result EVR. As illustrated, a second time T2 may be between (e.g., half way between) the first time T1 and the third time T3 in FIG. 3.

Figure 5:
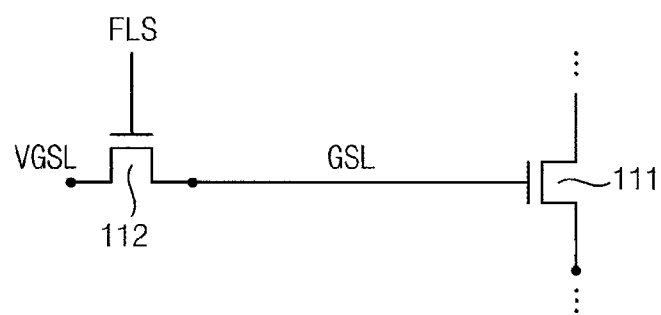
FIG. 5 illustrates a floating transistor connected to a ground selection line.

FIG. 5 illustrates a floating transistor connected to a ground selection line.

Referring to FIGS. 3 and 5, a ground selection line GSL that provides the ground selection voltage VGSL may be connected to a floating transistor 112 that is turned-on in response to a floating signal FLS. The floating transistor 112 may be turned-on until the first time T1 and the first ground selection voltage VGSL1 may be provided to the erase completion plane ECP. For example, the floating signal FLS may be a first logic level until the first time T1. The floating signal FLS may be a second logic level after the first time T1. The first logic level may be a logic high level and the second logic level may be a logic low level. When the floating signal FLS is at a first logic level until the first time T1, the floating transistor 112 may be turned-on. When the floating transistor 112 is turned-on, the first ground selection voltage VGSL1 may be provided to the gate of the ground selection transistor 111 through the ground selection line GSL. For example, the second plane 120, the third plane 130 and the fourth plane 140 may be the erase-completion plane ECP. When the first ground selection voltage VGSL1 is provided to the second plane 120, the third plane 130 and the fourth plane 140 until the first time T1, the ground selection transistor 111 may be turned-on. When the ground selection transistor 111 is turned-on, though 16V is applied to the P-well line PWELL, the hole may not be transferred through the channel between the source of the ground selection transistor 111 and the drain of the ground selection transistor 111. In case the hole is not transferred through the channel between the source of the ground selection transistor 111 and the drain of the ground selection transistor 111, the erase operation may not be performed.

The floating transistor 112 may be turned-off after the first time T1 and the ground selection line GSL may be floating. For example, the floating signal FLS may be the second logic level after the first time T1. When the floating signal FLS is the second logic level after the first time T1, the floating transistor 112 may be turned-off. When the floating transistor 112 is turned-off, the first ground selection voltage VGSL1 that is transferred from the voltage generator 300 may not be provided to the gate of the ground selection transistor 111 through the ground selection line GSL. When the provision of the first ground selection voltage VGSL1 to the second plane 120, the third plane 130 and the fourth plane 140 is stopped, the second ground selection line GSL2 connected to the second plane 120, the third ground selection line GSL3 connected to the third plane 130 and the fourth ground selection line GSL4 connected to the fourth plane 140 may be floating.

When the second ground selection line GSL2 connected to the second plane 120, the third ground selection line GSL3 connected to the third plane 130 and the fourth ground selection line GSL4 connected to the fourth plane 140 are floating, the voltage of the second ground selection line GSL2 connected to the second plane 120, the voltage of the third ground selection line GSL3 connected to the third plane 130 and the voltage of the fourth ground selection line GSL4 connected to the fourth plane 140 may change according to the erase voltage EV. For example, during the time interval between the first time T1 and the third time T3, the voltage of the second ground selection line GSL2, the voltage of the third ground selection line GSL3 and the voltage of the fourth ground selection line GSL4 may be increased according to the erase voltage EV. In addition, during the time interval between the third time T3 and the fourth time T4, the voltage of the second ground selection line GSL2, the voltage of the third ground selection line GSL3 and the voltage of the fourth ground selection line GSL4 may be maintained at a constant voltage according to the erase voltage EV. In addition, after the fourth time T4, the voltage of the second ground selection line GSL2, the voltage of the third ground selection line GSL3 and the voltage of the fourth ground selection line GSL4 may be decreased according to the erase voltage EV. When the ground selection line GSL is floating after the first time T1, because the voltage of the ground selection line GSL changes according to the erase voltage EV, the break down of the ground selection transistor 111 may be limited (and/or prevented).

In example embodiments, the floating transistor 112 may be turned-off after the first time T1 and the provision of the first ground selection voltage VGSL1 to the erase-completion plane ECP may be stopped.

Figure 6:
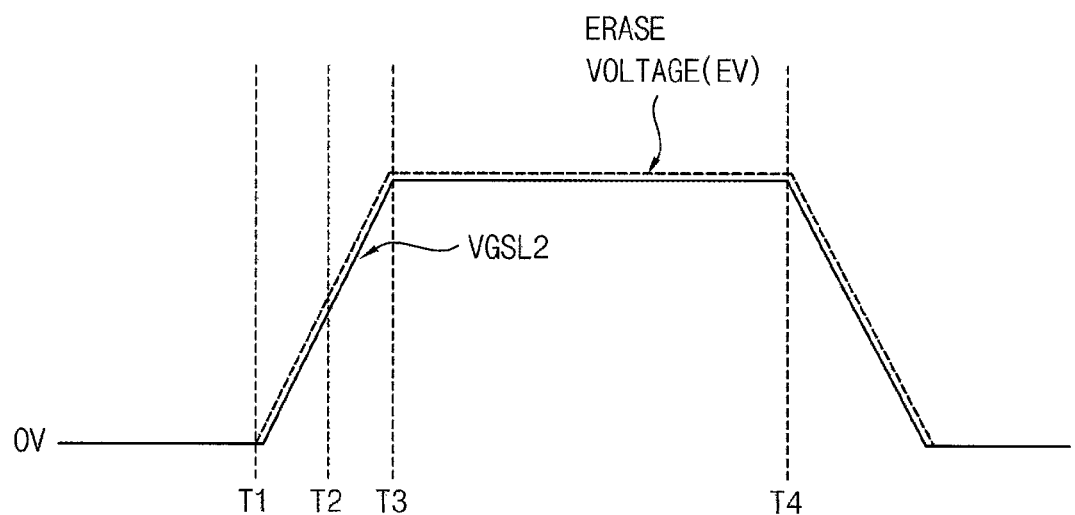
FIG. 6 is a diagram for explaining a second ground selection voltage in FIG. 1.

FIG. 6 is a diagram for explaining a second ground selection voltage in FIG. 1.

Referring to FIG. 6, the second ground selection voltage VGSL2 may be provided to the non erase-completion plane ENCP until a first time T1 when an erase voltage EV is provided to the memory cell array 100. For example, the second ground selection voltage VGSL2 may be 0V. The first ground selection voltage VGSL1 may be greater than the second ground selection voltage VGSL2. In example embodiments, the second ground selection voltage VGSL2 may be provided to the non erase-completion plane ENCP of the planes 110~140 until the first time T1.

For example, the erase voltage EV may be 0V before the first time T1. The erase voltage EV may be increased after the first time T1. The erase voltage EV may be 16V between the third time T3 and the fourth time T4. The erase voltage EV may be decreased after the fourth time T4. For example, the first plane 110 may be the non erase-completion plane ENCP. In case the second ground selection voltage VGSL2 is provided to the first plane 110 until the first time T1, the ground selection transistor 111 may be turned-off. In case the ground selection transistor 111 is turned-off, if 16V is applied to the P-well line PWELL, the hole may be transferred through the channel between a source of the ground selection transistor 111 and a drain of the ground selection transistor 111. In case the hole is transferred through the channel between the source of the ground selection transistor 111 and the drain of the ground selection transistor 111, the erase operation may be performed. In case the second ground selection voltage VGSL2 is provided to the first plane 110 until the first time T1, the erase operation for the first plane 110 may be performed. Therefore, while the erase operation for the first plane 110 is performed, the erase operation for the second plane 120, the third plane 130 and the fourth plane 140 may not be performed. The nonvolatile memory device 10 according to example embodiments may selectively perform the erase operation of the planes 110~140 by selectively providing the ground selection voltage VGSL that is applied to each of the planes 110~140 based on the erase verification result EVR. As illustrated, a second time T2 may be between (e.g., half way between) the first time T1 and the third time T3 in FIG. 6.

A ground selection line GSL that provides the ground selection voltage VGSL may be connected to a floating transistor 112 that is turned-on based on a floating signal FLS. In example embodiments, the floating transistor 112 may be turned-on until the first time T1 and the second ground selection voltage VGSL2 may be provided to the erase non-completion plane ENCP of the planes 110~140. For example, the floating signal FLS may be a first logic level until the first time T1. The floating signal FLS may be a second logic level after the first time T1. The first logic level may be a logic high level and the second logic level may be a logic low level. In case the floating signal FLS is the first logic level until the first time T1, the floating transistor 112 may be turned-on. In case the floating transistor 112 is turned-on, the second ground selection voltage VGSL2 that is transferred from the voltage generator 300 may be provided to the gate of the ground selection transistor 111 through the ground selection line GSL. For example, the first plane 110 may be the erase non-completion plane ENCP. When the second ground selection voltage VGSL2 is provided to the first plane 110 until the first time T1, the ground selection transistor 111 may be turned-off. In case the ground selection transistor 111 is turned-off, if 16V is applied to the P-well line PWELL, the hole may be transferred through the channel between the source of the ground selection transistor 111 and the drain of the ground selection transistor 111. When the hole is transferred through the channel between the source of the ground selection transistor 111 and the drain of the ground selection transistor 111, the erase operation may be performed.

In example embodiments, a ground selection line GSL that provides the second ground selection voltage VGSL2 may be floating after the first time T1. For example, the floating signal FLS may be the second logic level after the first time T1. When the floating signal FLS is the second logic level after the first time T1, the floating transistor 112 may be turned-off. When the floating transistor 112 is turned-off, the second ground selection voltage VGSL2 from the voltage generator 300 may not be provided to the gate of the ground selection transistor 111 through the ground selection line GSL. When provision of the second ground selection voltage VGSL2 to the first plane 110 is stopped, the first ground selection line GSL1 connected to the first plane 110 may be floating.

When the first ground selection line GSL1 connected to the first plane 110 is floating, the voltage of the first ground selection line GSL1 connected to the first plane 110 may change according to the erase voltage EV. For example, during the time interval between the first time T1 and the third time T3, the voltage of the first ground selection line GSL1 may be increased according to the erase voltage EV. In addition, during the time interval between the third time T3 and the fourth time T4, the voltage of the first ground selection line GSL1 may maintain a constant according to the erase voltage EV. In addition, after the fourth time T4, the voltage of the first ground selection line GSL1 may be decreased according to the erase voltage EV. When the ground selection line GSL is floating after the first time T1, because the voltage of the ground selection line GSL changes according to the erase voltage EV, the break down of the ground selection transistor 111 may be limited (and/or prevented).

Figure 7:
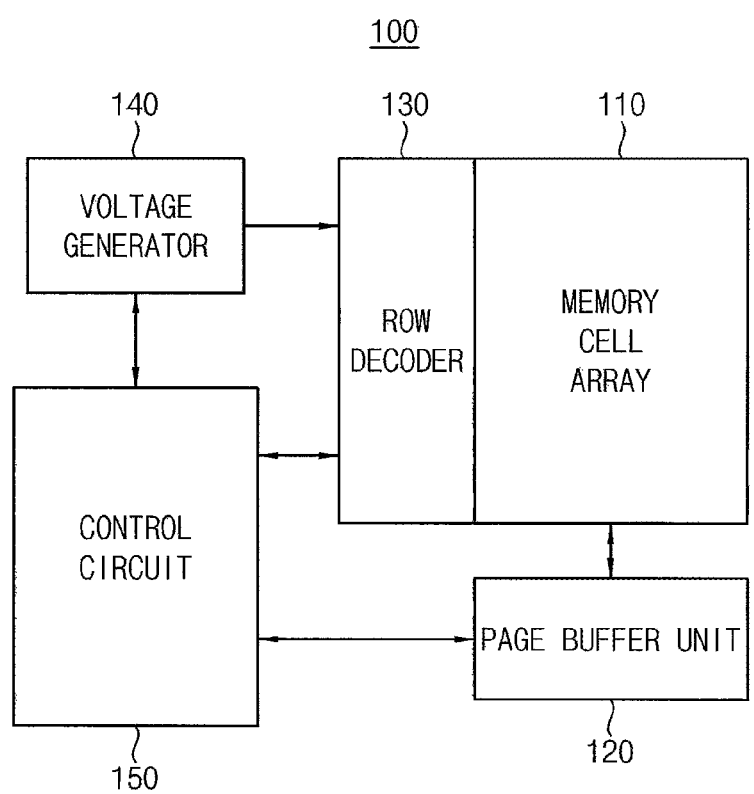
FIG. 7 is a block diagram illustrating a nonvolatile memory device according to example embodiments.
Figure 8:
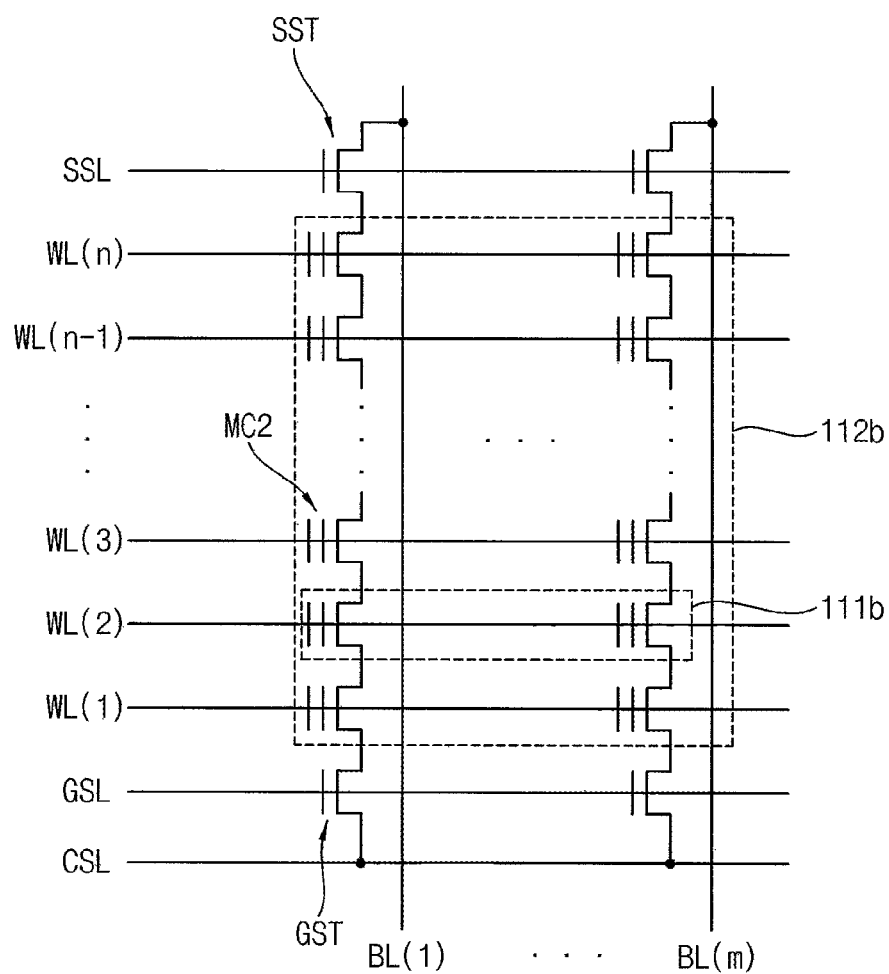
FIG. 8 is a diagram illustrating an example of a memory cell array in the nonvolatile memory device of FIG. 7.
Figure 9:
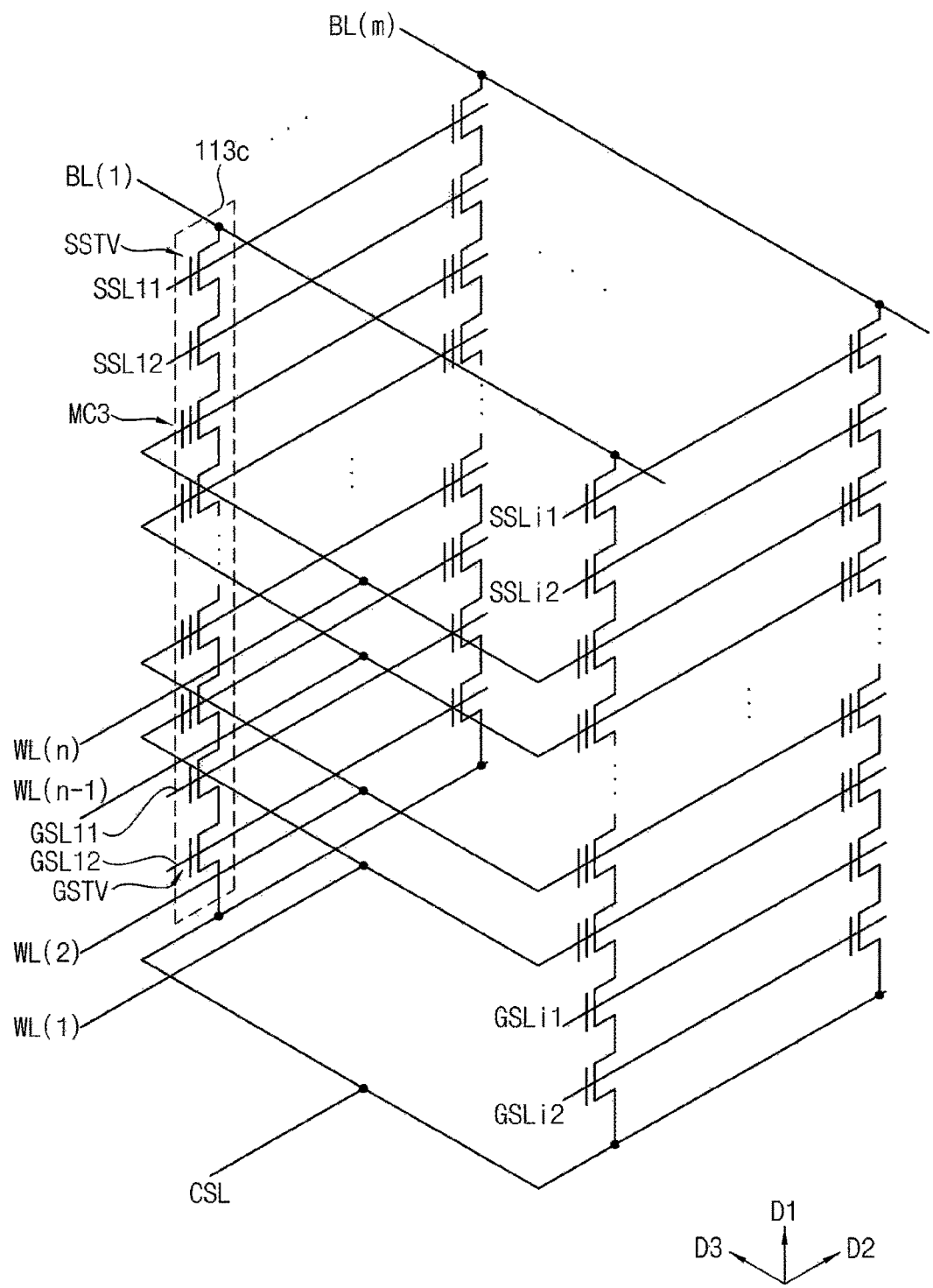
FIG. 9 is a diagram illustrating another example of a memory cell array in the nonvolatile memory device of FIG. 7.

FIG. 7 is a block diagram illustrating a nonvolatile memory device according to example embodiments. FIG. 8 is a diagram illustrating an example of a memory cell array in the nonvolatile memory device of FIG. 7. FIG. 9 is a diagram illustrating another example of a memory cell array in the nonvolatile memory device of FIG. 7.

Referring FIG. 7, a nonvolatile memory device 400 may be a flash nonvolatile memory device. The nonvolatile memory device 400 includes a memory cell array 410, a page buffer circuit 420, a row decoder 430, a voltage generator 440, and a control circuit 450. The memory cell array 410 may employ the memory cell array 100 in FIG. 1, and the voltage generator 440 may employ the voltage generator 300 in FIG. 1.

Memory cell array 410 includes multiple memory cells connected to multiple word lines and multiple bit lines, respectively. The memory cells may be NAND or NOR flash memory cells and may be arranged in a two or three dimensional array structure.

In example embodiments, the memory cells may be single level cells (SLCs) or multi-level cells (MLCs). In example embodiments including MLCs, a program scheme in a write mode may be, for instance, a shadow program scheme, a reprogrammable scheme, or an on-chip buffered program scheme.

Page buffer circuit 420 is connected to the bit lines and stores write data programmed in memory cell array 410 or read data sensed from memory cell array 410. In other words, page buffer circuit 420 may be operated as a write driver or a sensing amplifier according to an operation mode of flash nonvolatile memory device 400. For example, page buffer circuit 420 may be operated as the write driver in the write mode and as the sensing amplifier in the read mode.

Row decoder 430 is connected to the word lines WL and selects at least one of the word lines in response to a row address. Voltage generator 440 generates word line voltages such as a program voltage, a pass voltage, a verification voltage, an erase voltage and a read voltage according to a control of control circuit 450. Voltage generator 440 may generate a first ground selection voltage and a second ground selection voltage. Control circuit 450 controls page buffer circuit 420, row decoder 430 and voltage generator 440 to perform program, erase, and read operations on memory cell array 410.

Referring to FIG. 8, memory cell array 410b includes string selection transistors SST, ground selection transistors GST and memory cells MC2. String selection transistors SST are connected to bit lines BL(1), . . . , BL(m), and ground selection transistors GST are connected to common source line CSL. Memory cells MC2 disposed in the same row are disposed in series between one of bit lines BL(1), . . . , BL(m) and common source line CSL, and memory cells MCs disposed in the same column are connected in common to one of word lines WL(1), WL(2), WL(3), . . . , WL(n−1), WL(n). That is memory cells MC2 are connected in series between string selection transistors SST and ground selection transistors GST, and the word lines WL (e.g., 16, 32, or 64) are disposed between string selection line SSL and ground selection line GSL.

String selection transistors SST are connected to string selection line SSL such that string selection transistors SST may be controlled according to a level of the voltage applied from string selection line SSL thereto. Memory cells MC2 may be controlled according to a level of a voltage applied to word lines WL(1), . . . , WL(n).

The NAND flash nonvolatile memory device comprising memory cell array 410b performs write and read operations in units of page 111b, and it performs erase operations in units of block 412b. Meanwhile, according to example embodiments, each of the page buffers may be connected to even and odd bit lines one by one. In this case, the even bit lines form an even page, the odd bit lines form an odd page, and the even and odd pages may perform by turns and sequentially the write operation into memory cells MC2.

Referring FIG. 9, memory cell array 410c comprises multiple strings 413c having a vertical structure. Strings 413c are formed in the second direction D2 to form a string row. Multiple string rows are formed in the third row to form a string array. Each of strings 413c comprises ground selection transistors GSTV, memory cells MC3, and string selection transistors SSTV, which are disposed in series in the first direction D1 between bit lines BL(1), . . . , BL(m) and common source line CSL.

Ground selection transistors GSTV are connected to ground selection lines GSL11, GSL12, GSLi1, and GSLi2, respectively, and string selection transistors SSTV are connected to string selection lines SSL11, SSL12, . . . , SSLi1, SSLi2, respectively. Memory cells MC3 disposed the same layer are connected in common to one of word lines WL(1), WL(2), . . . , WL(n−1), WL(n). Ground selection lines GSL11, . . . , GSLi2 and string selection lines SSL11, . . . , SSLi2 extend in the second direction D2 and are formed along the third direction D3. Word lines WL(1), . . . , WL(n) extend in the second direction and are formed along the first D1 and third directions D3. Bit lines BL(1), . . . , BL(m) extend in the third direction and are formed along the second direction. Memory cells MC3 are controlled according to a level of a voltage applied to word lines WL(1), . . . , WL(n).

Because the vertical flash nonvolatile memory device comprising memory cell array 110c comprises NAND flash memory cells, like the NAND flash nonvolatile memory device, the vertical flash nonvolatile memory device performs the write and read operations in units of pages and the erase operation in units of block.

In example embodiments, two string selection transistors in one string 413c are connected to one string selection line and two ground selection transistors in one string are connected to one ground selection line. Further, according to example embodiments, one string comprises one string selection transistor and one ground selection transistor.

In example embodiments, the memory cell array 410c may be a three dimensional memory array. In addition, in example embodiments, a three dimensional (3D) memory array is provided in the nonvolatile memory device 10. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines WL and/or bit-lines BL shared between levels: U.S. Pat. Nos. 7,679,133; 8,553,466; 8,654, 587; 8,559,235; and U.S. Pat. Pub. No. 2011/0233648.

Figure 10:
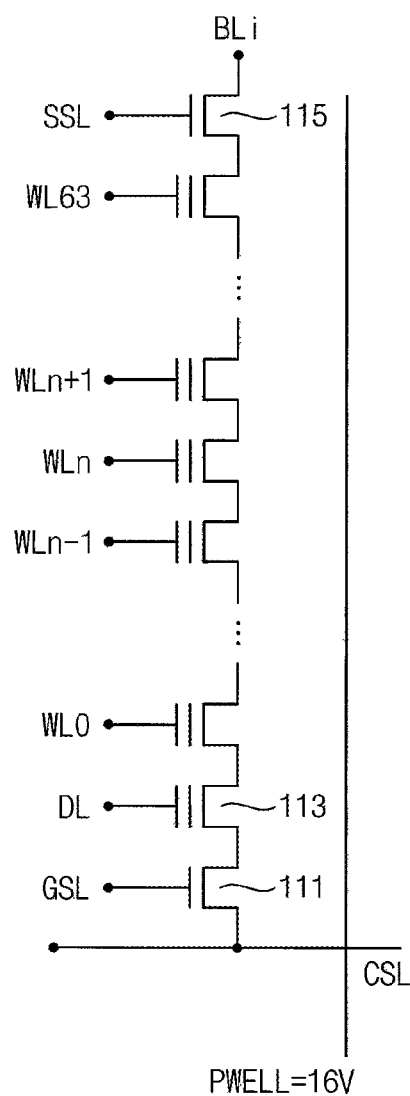
FIG. 10 is a diagram for explaining another example of plane included in the memory cell array of FIG. 2.
Figure 11:
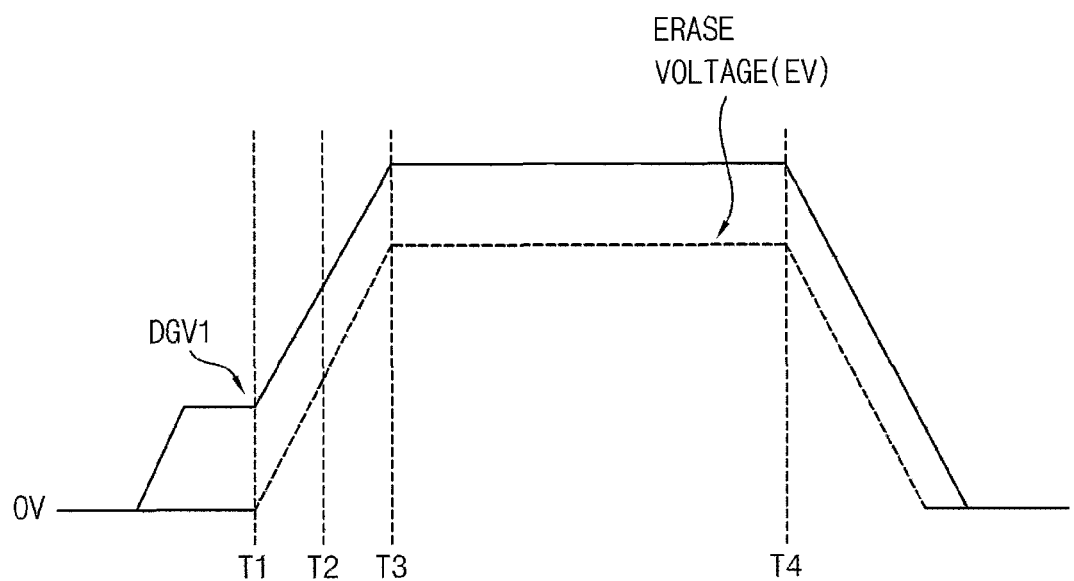
FIG. 11 is illustrates a first dummy gate voltage that is provided to a gate of a dummy transistor in FIG. 10.

FIG. 10 is a diagram for explaining another example of plane included in the memory cell array of FIG. 2 and FIG. 11 is illustrates a first dummy gate voltage that is provided to a gate of the dummy transistor in FIG. 10.

Referring to FIGS. 10 and 11, the NAND string of one plane in the memory cell array 100 may further include a dummy transistor 113 connected between a first cell transistor and the ground selection transistor 111. The voltage generator 300 selectively provides a dummy gate voltage DGV to a gate of the dummy transistor 113 based on the erase verification result EVR. The dummy gate voltage DGV may be equal to the ground selection voltage VGSL.

In example embodiments, the voltage generator 300 provides a first dummy gate voltage DVG1 to an erase-completion plane ECP based on the erase verification result EVR. The voltage generator 300 may provide a second dummy gate voltage DVG2 to an erase non-completion plane ENCP based on the erase verification result EVR. In example embodiments, the first dummy gate voltage DGV may be greater than the second dummy gate voltage DGV2.

In example embodiments, the first dummy gate voltage DGV1 may be provided to the erase-completion plane ECP of the planes 110~140 until a first time T1 when an erase voltage EV is provided to the memory cell array 100. For example, the erase voltage EV may be 0V before the first time T1. The erase voltage EV may be increased after the first time T1. The erase voltage EV may be 16V between the third time T3 and the fourth time T4. The erase voltage EV may be decreased after the fourth time T4. For example, the second plane 120, the third plane 130 and the fourth plane 140 may be the erase-completion plane ECP. When the first dummy gate voltage DGV1 is provided to the second plane 120, the third plane 130 and the fourth plane 140, the dummy transistor 113 may be turned-on. When the dummy transistor 113 is turned-on, though 16V is applied to the P-well line PWELL, the hole may not be transferred through the channel between a source of the dummy transistor 113 and a drain of the dummy transistor 113. When the hole is not transferred through the channel between the source of the dummy transistor 113 and the drain of the dummy transistor 113, the erase operation may not be performed. When the first dummy gate voltage DGV1 is provided to the second plane 120, the third plane 130 and the fourth plane 140 until the first time T1, the erase operation for the second plane 120, the third plane 130 and the fourth plane 140 may not be performed. Therefore, while the erase operation for the first plane 110 is performed, the erase operation for the second plane 120, the third plane 130 and the fourth plane 140 may not be performed. The nonvolatile memory device 10 according to example embodiments may selectively perform the erase operation of the planes 110 TO 140 by selectively providing the ground selection voltage VGSL that is applied to each of the planes 110 TO 140 based on the erase verification result EVR. As illustrated, a second time T2 may be between (e.g., halfway between) the first time T1 and the third time T3 in FIG. 11.

Figure 12:
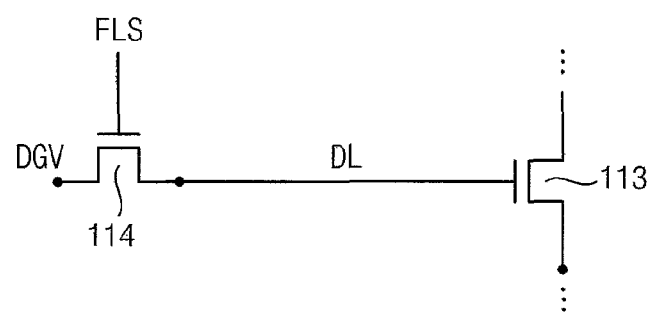
FIG. 12 is illustrates a floating transistor connected to a dummy gate line in FIG. 10.

FIG. 12 is illustrates a floating transistor connected to the dummy gate line in FIG. 10.

Referring to FIG. 12, a dummy gate line DL that provides the dummy gate voltage DGV may be connected to a floating transistor 114 that is turned-on based on a floating signal FLS. In example embodiments, the floating transistor 114 may be turned-on until the first time T1 and the first dummy gate voltage DGV1 may be provided to the erase-completion plane ECP of the planes 110 TO 140. For example, the floating signal FLS may be a first logic level until the first time T1. The floating signal FLS may be a second logic level after the first time T1. The first logic level may be a logic high level and the second logic level may be a logic low level. In case the floating signal FLS is the first logic level until the first time T1, the floating transistor 114 may be turned-on. In case the floating transistor 114 is turned-on, the first dummy gate voltage DGV1 may be provided to the gate of the dummy transistor 113 through the dummy gate line DL. For example, the second plane 120, the third plane 130 and the fourth plane 140 may be the erase-completion plane ECP. In case the first dummy gate voltage DGV1 is provided to the second plane 120, the third plane 130 and the fourth plane 140 until the first time T1, the dummy transistor 113 may be turned-on. In case the dummy transistor 113 is turned-on, though 16V is applied to the P-well line PWELL, the hole may not be transferred through the channel between the source of the dummy transistor 113 and the drain of the dummy transistor 113. When the hole is not transferred through the channel between the source of the dummy transistor 113 and the drain of the dummy transistor 113, the erase operation may not be performed.

In example embodiments, a dummy gate line DL that provides the first dummy gate voltage DGV1 may be floating after the first time T1. For example, the floating signal FLS may be the second logic level after the first time T1. In case the floating signal FLS is the second logic level after the first time T1, the floating transistor 114 may be turned-off. In case the floating transistor 114 is turned-off, the first dummy gate voltage DGV1 may not be provided to the gate of the dummy transistor 113 through the dummy gate line DL. In case providing the first dummy gate voltage DGV1 to the second plane 120, the third plane 130 and the fourth plane 140 is stopped, the second dummy gate line connected to the second plane 120, the third dummy gate line connected to the third plane 130 and the fourth dummy gate line connected to the fourth plane 140 may be floating.

When the second dummy gate line connected to the second plane 120, the third dummy gate line connected to the third plane 130 and the fourth dummy gate line connected to the fourth plane 140 is floating, the voltage of the second dummy gate line connected to the second plane 120, the voltage of the third dummy gate line connected to the third plane 130 and the voltage of the fourth dummy gate line connected to the fourth plane 140 may change according to the erase voltage EV. For example, during the time interval between the first time T1 and the third time T3, the voltage of the second dummy gate line, the voltage of the third dummy gate line and the voltage of the fourth dummy gate line may be increased according to the erase voltage EV. In addition, during the time interval between the third time T3 and the fourth time T4, the voltage of the second dummy gate line, the voltage of the third dummy gate line and the voltage of the fourth dummy gate line may maintain a constant according to the erase voltage EV. In addition, after the fourth time T4, the voltage of the second dummy gate line, the voltage of the third dummy gate line and the voltage of the fourth dummy gate line may be decreased according to the erase voltage EV. In case the dummy gate line DL is floating after the first time T1, because the voltage of the dummy gate line DL changes according to the erase voltage EV, the break down of the dummy transistor 113 may be limited (and/or prevented).

Figure 13:
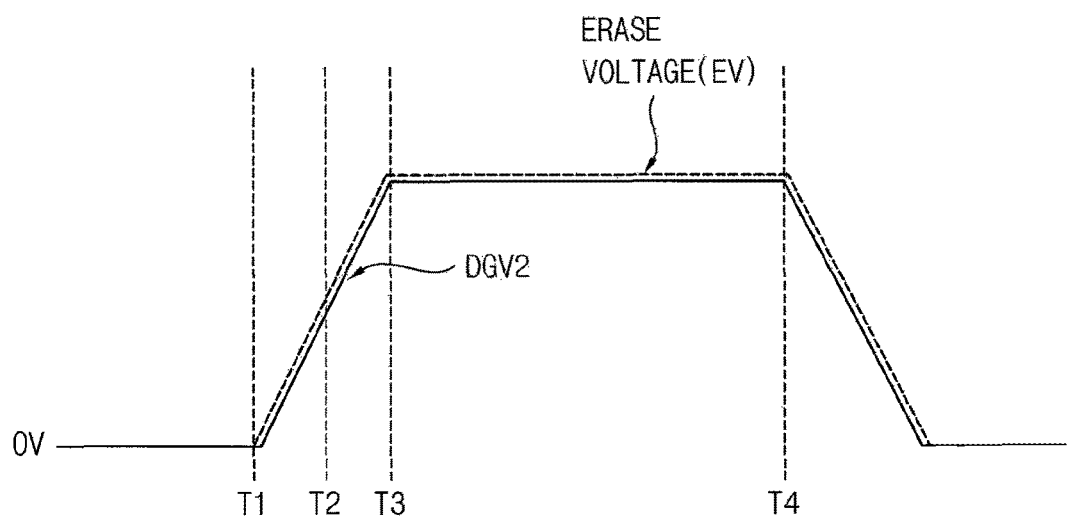
FIG. 13 is a diagram for explaining a second dummy gate voltage that is provided to a gate of the dummy transistor in FIG. 10.

FIG. 13 is a diagram for explaining a second dummy gate voltage that is provided to a gate of the dummy transistor in FIG. 10.

Referring to FIG. 13, the voltage generator 300 provides the second dummy gate voltage DGV2 to the non erase-completion plane ENCP of the planes 110~140 based on the erase verification result EVR. For example, the second dummy gate voltage DGV2 may be 0V. The first dummy gate voltage DGV1 may be greater than the second dummy gate voltage DGV2. The first dummy gate voltage DGV1 may be equal to the first ground selection voltage VGSL1 and the second dummy gate voltage DGV2 may be equal to the second ground selection voltage VGSL2. In example embodiments, the second dummy gate voltage DGV2 may be provided to the non erase-completion plane ENCP of the planes 110 TO 140 until the first time T1.

For example, the erase voltage EV may be 0V before the first time T1. The erase voltage EV may be increased after the first time T1. The erase voltage EV may be 16V between the third time T3 and the fourth time T4. The erase voltage EV may be decreased after the fourth time T4. For example, the first plane 110 may be the non erase-completion plane ENCP. In case the second dummy gate voltage DGV2 is provided to the first plane 110 until the first time T1, the dummy transistor 113 may be turned-off. When the dummy transistor 113 is turned-off, if 16V is applied to the P-well line PWELL, the hole may be transferred through the channel between a source of the dummy transistor 113 and a drain of the dummy transistor 113. When the hole is transferred through the channel between the source of the dummy transistor 113 and the drain of the dummy transistor 113, the erase operation may be performed. In case the second dummy gate voltage DGV2 is provided to the first plane 110 until the first time T1, the erase operation for the first plane 110 may be performed. Therefore, while the erase operation for the first plane 110 is performed, the erase operation for the second plane 120, the third plane 130 and the fourth plane 140 may not be performed. The nonvolatile memory device 10 according to example embodiments may selectively perform the erase operation on the planes 110~140 by selectively providing the ground selection voltage VGSL and the dummy gate voltage DGV that are applied to each of the planes 110~140 based on the erase verification result EVR. As illustrated, a second time T2 may be between (e.g., half way between) the first time T1 and the third time T3 in FIG. 13.

A dummy gate line DL that provides the dummy gate voltage DGV may be connected to a floating transistor 114 that is turned-on based on a floating signal FLS. In example embodiments, the floating transistor 114 may be turned-on until the first time T1 and the second dummy gate voltage DGV2 may be provided to the non erase-completion plane ENCP of the planes 110~140. For example, the floating signal FLS may be a first logic level until the first time T1. The floating signal FLS may be a second logic level after the first time T1. The first logic level may be a logic high level and the second logic level may be a logic low level. In case the floating signal FLS is the first logic level until the first time T1, the floating transistor 114 may be turned-on. In case the floating transistor 114 is turned-on, the second dummy gate voltage DGV2 that is transferred from the voltage generator 300 may be provided to the gate of the dummy transistor 113 through the dummy gate line DL. For example, the first plane 110 may be the non erase-completion plane ENCP. In case the second dummy gate voltage DGV2 is provided to the first plane 110 until the first time T1, the dummy transistor 113 may be turned-off. In case the dummy transistor 113 is turned-off, if 16V is applied to the P-well line PWELL, the hole may be transferred through the channel between the source of the dummy transistor 113 and the drain of the dummy transistor 113. In case the hole is transferred through the channel between the source of the dummy transistor 113 and the drain of the dummy transistor 113, the erase operation may be performed.

In example embodiments, a dummy gate line DL that provides the second dummy gate voltage DGV2 may be floating after the first time T1. For example, the floating signal FLS may be the second logic level after the first time T1. When the floating signal FLS is the second logic level after the first time T1, the floating transistor 114 may be turned-off. In case the floating transistor 114 is turned-off, the second dummy gate voltage DGV2 may not be provided to the gate of the dummy transistor 113 through the dummy gate line DL. In case providing the second dummy gate voltage DGV2 to the first plane 110 is stopped, the first dummy gate line DL1 connected to the first plane 110 may be floating.

When the first dummy gate line DL1 connected to the first plane 110 is floating, the voltage of the first dummy gate line DL1 connected to the first plane 110 may change according to the erase voltage EV. For example, during the time interval between the first time T1 and the third time T3, the voltage of the first dummy gate line DL1 may be increased according to the erase voltage EV. In addition, during the time interval between the third time T3 and the fourth time T4, the voltage of the first dummy gate line DL1 may maintain a constant according to the erase voltage EV. In addition, after the fourth time T4, the voltage of the first dummy gate line DL1 may be decreased according to the erase voltage EV. When the dummy gate line DL is floating after the first time T1, because the voltage of the dummy gate line DL changes according to the erase voltage EV, the break down of the dummy transistor 113 may be limited (and/or prevented).

Figure 14:
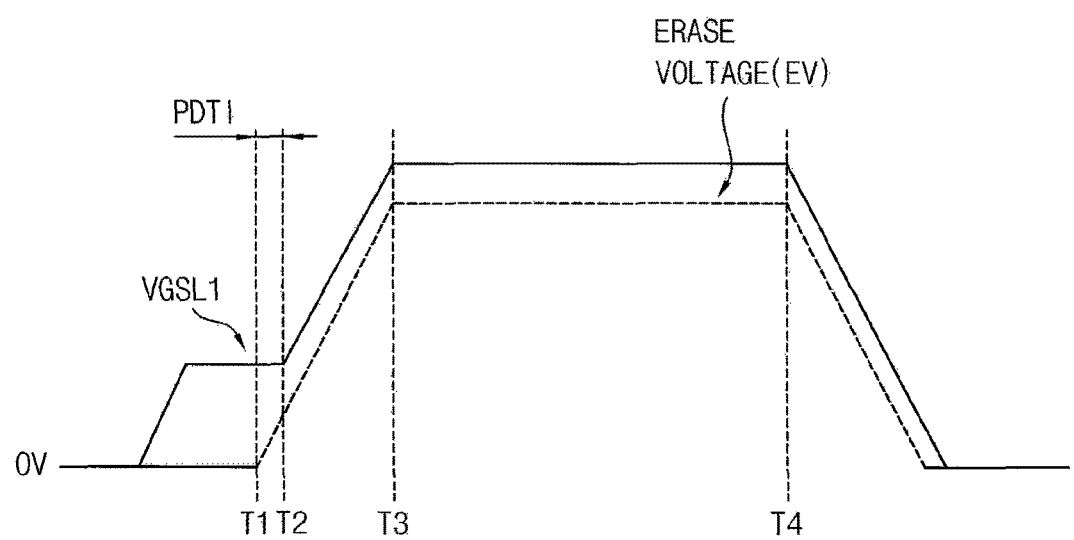
FIG. 14 is a diagram for explaining a first ground selection voltage that is provided to the nonvolatile memory device of FIG. 1.

FIG. 14 is a diagram for explaining a first ground selection voltage that is provided to the nonvolatile memory device of FIG. 1.

Referring to FIG. 14, the first ground selection voltage VGSL1 may be provided to the erase-completion plane ECP of the planes 110~140 from a first time T1 to a second time T2. The first time T1 may be a time when an erase voltage EV is provided to the memory cell array 100. The second time T2 may be after a desired (and/or alternatively predetermined) time interval PDTI from the first time T1. For example, the erase voltage EV may be 0V before the first time T1. The erase voltage EV may be increased after the first time T1. The erase voltage EV may be 16V between the third time T3 and the fourth time T4. The erase voltage EV may be decreased after the fourth time T4. For example, the second plane 120, the third plane 130 and the fourth plane 140 may be the erase-completion plane ECP. In case the first ground selection voltage VGSL1 is provided to the second plane 120, the third plane 130 and the fourth plane 140 from the first time T1 to the second time T2, the ground selection transistor 111 may be turned-on. In case the ground selection transistor 111 is turned-on, though 16V is applied to the P-well line PWELL, the hole may not be transferred through the channel between a source of the ground selection transistor 111 and a drain of the ground selection transistor 111. When the hole is not transferred through the channel between the source of the ground selection transistor 111 and the drain of the ground selection transistor 111, the erase operation may not be performed. In case the first ground selection voltage VGSL1 is provided to the second plane 120, the third plane 130 and the fourth plane 140 until the second time T2, the erase operation for the second plane 120, the third plane 130 and the fourth plane 140 may not be performed. Therefore, while the erase operation for the first plane 110 is performed, the erase operation for the second plane 120, the third plane 130 and the fourth plane 140 may not be performed. The nonvolatile memory device 10 according to example embodiments may selectively perform the erase operation of the planes 110~140 by selectively providing the ground selection voltage VGSL that is applied to each of the planes 110~140 based on the erase verification result EVR.

In example embodiments, a ground selection line GSL that provides the ground selection voltage VGSL may be floating after the second time T2. For example, the floating signal FLS may be the second logic level after the second time T2. When the floating signal FLS is the second logic level after the second time T2, the floating transistor 112 may be turned-off. When the floating transistor 112 is turned-off, the first ground selection voltage VGSL1 that is transferred from the voltage generator 300 may not be provided to the gate of the ground selection transistor 111 through the ground selection line GSL. In case providing the first ground selection voltage VGSL1 to the second plane 120, the third plane 130 and the fourth plane 140 is stopped, the second ground selection line GSL2 connected to the second plane 120, the third ground selection line GSL3 connected to the third plane 130 and the fourth ground selection line GSL4 connected to the fourth plane 140 may be floating.

When the second ground selection line GSL2 connected to the second plane 120, the third ground selection line GSL3 connected to the third plane 130 and the fourth ground selection line GSL4 connected to the fourth plane 140 are floating, the voltage of the second ground selection line GSL2 connected to the second plane 120, the voltage of the third ground selection line GSL3 connected to the third plane 130 and the voltage of the fourth ground selection line GSL4 connected to the fourth plane 140 may change according to the erase voltage EV. For example, during the time interval between the second time T2 and the third time T3, the voltage of the second ground selection line GSL2, the voltage of the third ground selection line GSL3 and the voltage of the fourth ground selection line GSL4 may be increased according to the erase voltage EV. In addition, during the time interval between the third time T3 and the fourth time T4, the voltage of the second ground selection line GSL2, the voltage of the third ground selection line GSL3 and the voltage of the fourth ground selection line GSL4 may maintain a constant according to the erase voltage EV. In addition, after the fourth time T4, the voltage of the second ground selection line GSL2, the voltage of the third ground selection line GSL3 and the voltage of the fourth ground selection line GSL4 may be decreased according to the erase voltage EV. In case the ground selection line GSL is floating after the second time T2, because the voltage of the ground selection line GSL changes according to the erase voltage EV, the break down of the ground selection transistor 111 may be limited (and/or prevented).

Figure 15:
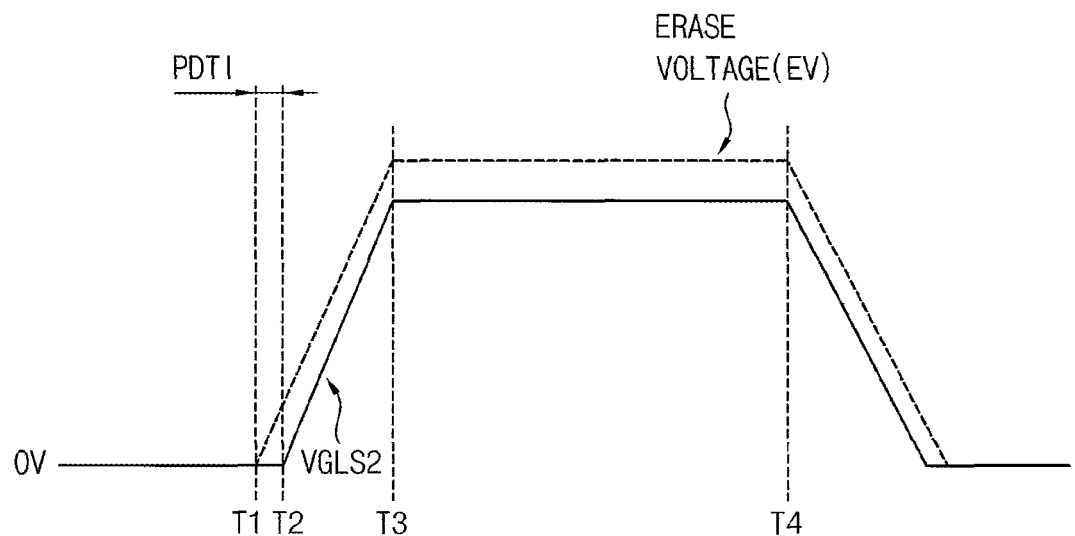
FIG. 15 is a diagram for explaining a second ground selection voltage that is provided to the nonvolatile memory device of FIG. 1.

FIG. 15 is a diagram for explaining a second ground selection voltage that is provided to the nonvolatile memory device of FIG. 1.

Referring to FIG. 15, the second ground selection voltage VGSL2 may be provided to the non erase-completion plane ENCP of the planes 110~140 from a first time T1 to a second time T2. The first time T1 may be a time when an erase voltage EV is provided to the memory cell array 100. The second time T2 may be after a desired (and/or alternatively predetermined) time interval PDTI from the first time T1. For example, the floating signal FLS may be a first logic level until the second time T2. The floating signal FLS may be a second logic level after the second time T2. The first logic level may be a logic high level and the second logic level may be a logic low level. When the floating signal FLS is the first logic level until the second time T2, the floating transistor 112 may be turned-on. In case the floating transistor 112 is turned-on, the second ground selection voltage VGSL2 that is transferred from the voltage generator 300 may be provided to the gate of the ground selection transistor 111 through the ground selection line GSL. For example, the first plane 110 may be the non erase-completion plane ENCP. In case the second ground selection voltage VGSL2 is provided to the first plane 110 until the second time T2, the ground selection transistor 111 may be turned-off. In case the ground selection transistor 111 is turned-off, if 16V is applied to the P-well line PWELL, the hole may be transferred through the channel between the source of the ground selection transistor 111 and the drain of the ground selection transistor 111. In case the hole is transferred through the channel between the source of the ground selection transistor 111 and the drain of the ground selection transistor 111, the erase operation may be performed.

In example embodiments, a ground selection line GSL that provides the ground selection voltage VGSL may be floating after the second time T2. For example, the floating signal FLS may be the second logic level after the second time T2. In case the floating signal FLS is the second logic level after the second time T2, the floating transistor 112 may be turned-off. In case the floating transistor 112 is turned-off, the second ground selection voltage VGSL2 that is transferred from the voltage generator 300 may not be provided to the gate of the ground selection transistor 111 through the ground selection line GSL. In case providing the second ground selection voltage VGSL2 to the first plane 110 is stopped after the second time T2, the first ground selection line GSL1 connected to the first plane 110 may be floating.

In case the first ground selection line GSL1 connected to the first plane 110 is floating, the voltage of the first ground selection line GSL1 connected to the first plane 110 may change according to the erase voltage EV. For example, during the time interval between the second time T2 and the third time T3, the voltage of the first ground selection line GSL1 may be increased according to the erase voltage EV. In addition, during the time interval between the third time T3 and the fourth time T4, the voltage of the first ground selection line GSL1 may maintain a constant according to the erase voltage EV. In addition, after the fourth time T4, the voltage of the first ground selection line GSL1 may be decreased according to the erase voltage EV. In case the ground selection line GSL is floating after the second time T2, because the voltage of the ground selection line GSL changes according to the erase voltage EV, the break down of the ground selection transistor 111 may be limited (and/or prevented).

Figure 16:
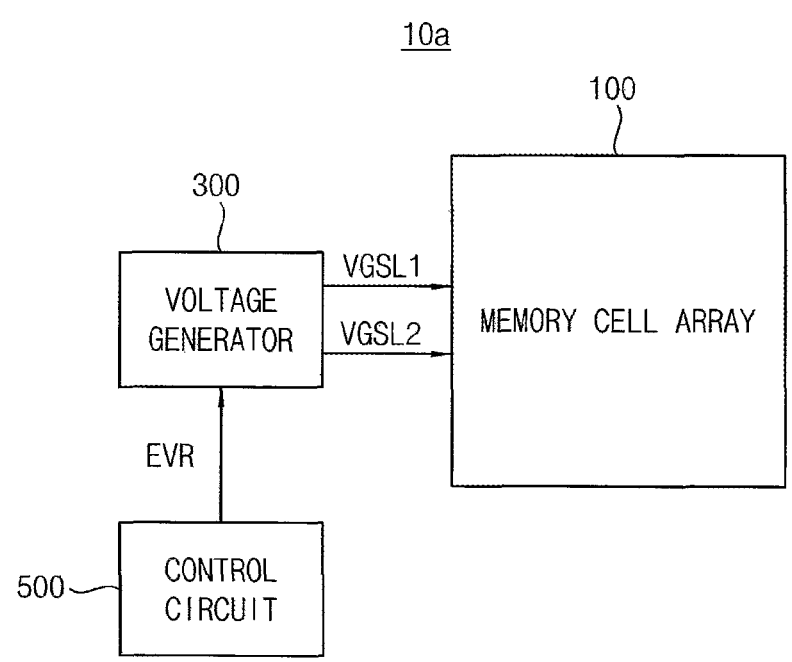
FIG. 16 is a block diagram illustrating a nonvolatile memory device according to example embodiments.

FIG. 16 is a block diagram illustrating a nonvolatile memory device according to example embodiments.

Referring to FIG. 16, a nonvolatile memory device 10a includes a memory cell array 100, a control circuit 500 and a voltage generator 300.

The nonvolatile memory device 10a further include the control circuit 500 that perform an erase verification on each of planes in the memory cell array 100 and provides an erase verification result EVR to the voltage generator 300.

Figure 17:
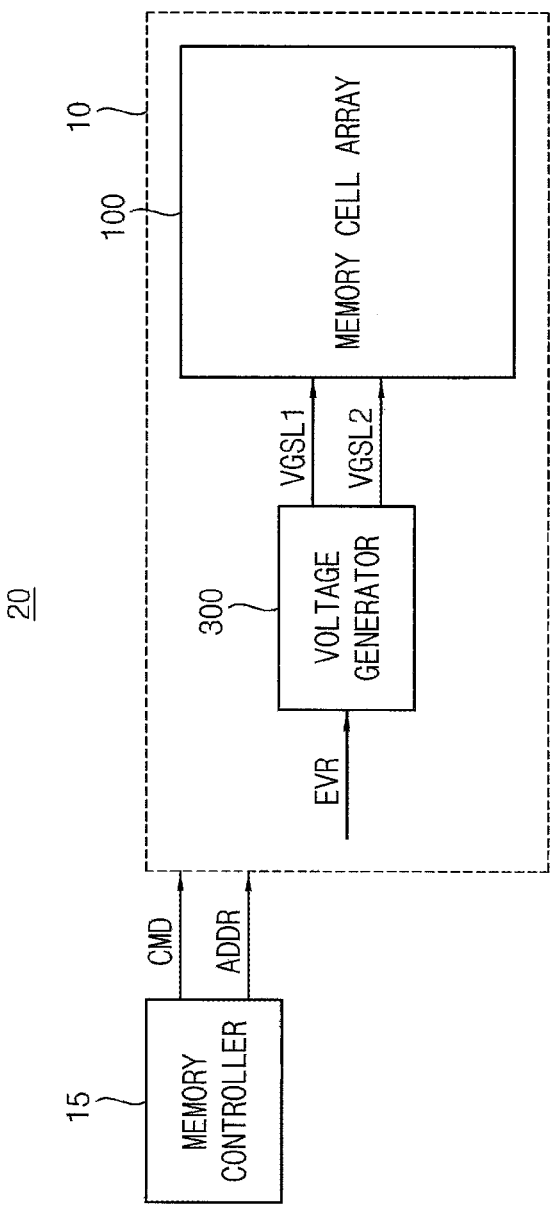
FIG. 17 is a block diagram illustrating a memory system according to example embodiments.
Figure 18:
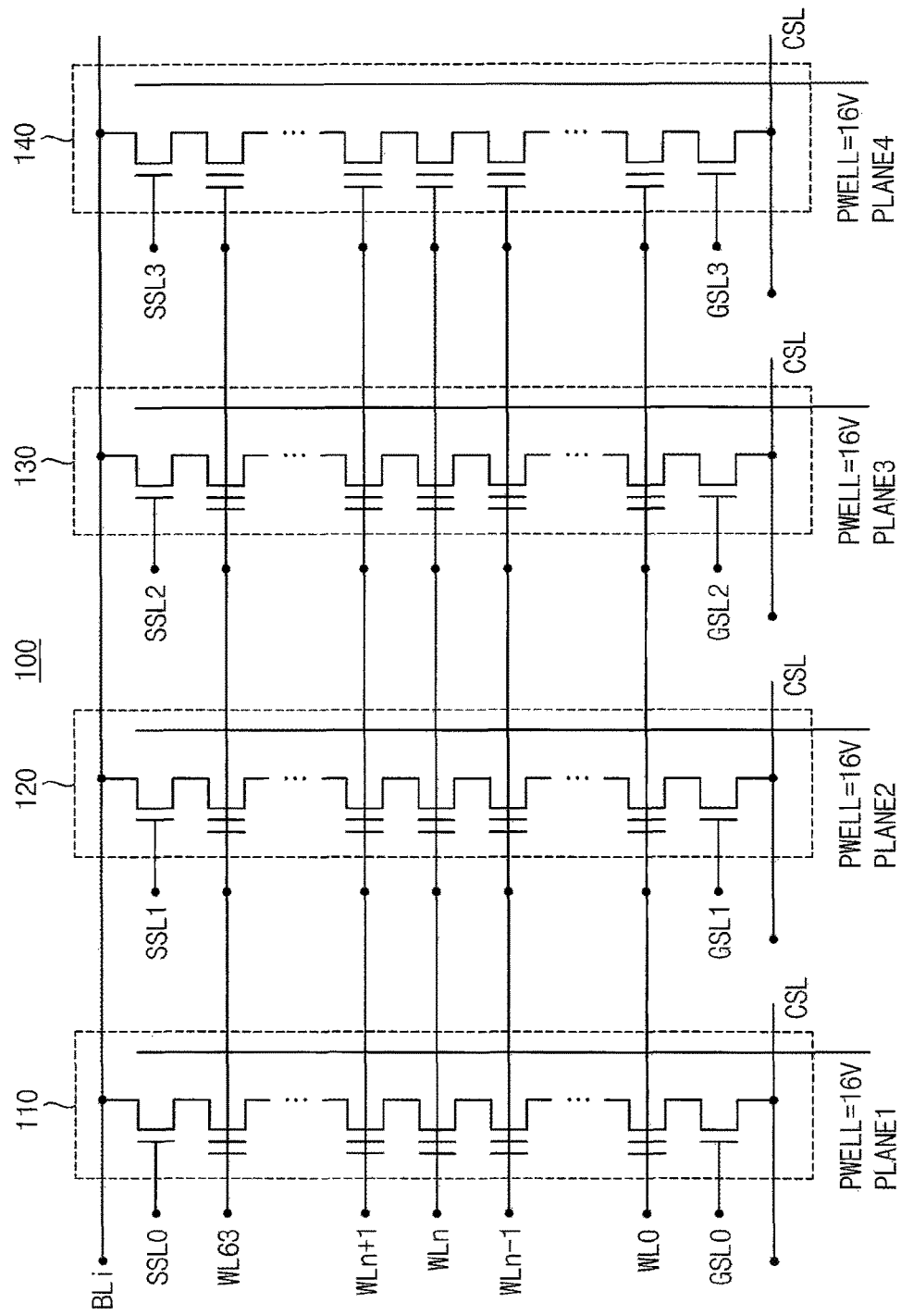
FIG. 18 is a diagram illustrating an example of a memory cell array included in the memory system of FIG. 17.

FIG. 17 is a block diagram illustrating a memory system according to example embodiments and FIG. 18 is a diagram illustrating an example of a memory cell array included in the memory system of FIG. 17.

Referring to FIGS. 17 and 18, a memory system 20 includes a memory controller 15 and a volatile memory device 10. The memory controller 15 provides a command CMD and an address ADDR to the nonvolatile memory device 10. The nonvolatile memory device 10 operates based on the command CMD and the address ADDR. The nonvolatile memory device 10 includes a memory cell array 100 and a voltage generator 300.

The memory cell array 100 includes a plurality of memory cells that are coupled to a plurality of word lines and a plurality of bit lines. The memory cell array 100 includes a plurality of planes 110~140, and each of the planes 110~140 receives a corresponding ground selection voltage VGSL. For example, the memory cell array 100 may include first to fourth planes 110~140. One memory block, unit of an erase operation of the nonvolatile memory device 10 may include at least one of the first to fourth planes 110~140. The first plane 110 may receive the ground selection voltage VGSL through a first ground selection line GSL1. In addition, the second plane 120 may receive the ground selection voltage VGSL through a second ground selection line GSL2. In addition, the third plane 130 may receive the ground selection voltage VGSL through a third ground selection line GSL3. The fourth plane 140 may receive the ground selection voltage VGSL through a fourth ground selection line GSL4.

The voltage generator 300 selectively provides one of a first ground selection voltage VGSL1 and a second ground selection voltage VGSL as the ground selection voltage to each of the planes 110~140 based on an erase verification result EVR (or result of an erase verification operation on each of the planes 110~140). The nonvolatile memory device 10 may perform the erase operation to erase data of the memory cells included in the first to fourth planes 110~140. After the nonvolatile memory device 10 perform the erase operation, the nonvolatile memory device 10 may perform the erase verification operation to determine whether the data of the memory cells included in the first to fourth planes 110~140 is completely erased or not. When the nonvolatile memory device 10 performs the erase verification operation, the nonvolatile memory device 10 may generate the erase verification result EVR for the first to fourth planes 110~140.

Figure 19:
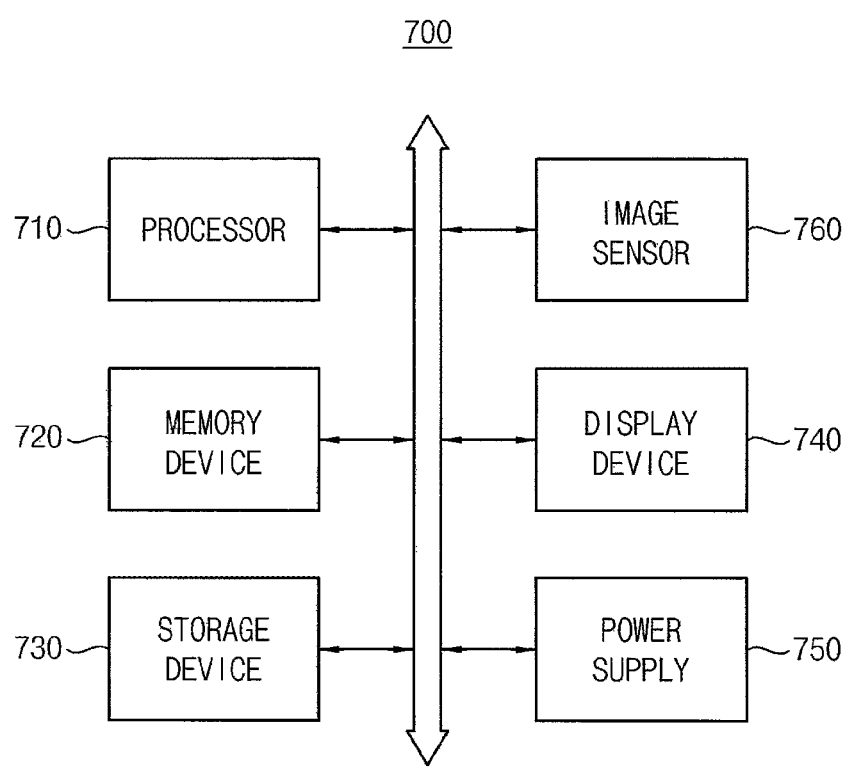
FIG. 19 is a block diagram illustrating a mobile system including the nonvolatile memory device according to example embodiments.

FIG. 19 is a block diagram illustrating a mobile system including the nonvolatile memory device according to example embodiments.

Referring to FIG. 19, a mobile system 700 may include a processor 710, a memory device 720, a storage device 730, a display device 740, a power supply 750 and an image sensor 760. The mobile system 700 may further include ports that communicate with a video card, a sound card, a memory card, a USB device, other electronic devices, etc.

The processor 710 may perform various calculations or tasks. According to example embodiments, the processor 710 may be a microprocessor or a CPU. The processor 710 may communicate with the memory device 720, the storage device 730, and the display device 740 via an address bus, a control bus, and/or a data bus. In example embodiments, the processor 710 may be coupled to an extended bus, such as a peripheral component interconnection (PCI) bus. The memory device 720 may store data for operating the computing system 700. For example, the memory device 720 may be implemented with a dynamic random access memory (DRAM) device, a mobile DRAM device, a static random access memory (SRAM) device, a phase-change random access memory (PRAM) device, a ferroelectric random access memory (FRAM) device, a resistive random access memory (RRAM) device, and/or a magnetic random access memory (MRAM) device. The memory device 720 includes the data loading circuit according to example embodiments. The storage device 730 may include a solid state drive (SSD), a hard disk drive (HDD), a CD-ROM, etc. The mobile system 700 may further include an input device such as a touchscreen, a keyboard, a keypad, a mouse, etc., and an output device such as a printer, a display device, etc. The power supply 750 supplies operation voltages for the computing system 700.

The storage device 730 may employ the nonvolatile memory device 10 of FIG. 1.

The image sensor 760 may communicate with the processor 710 via the buses or other communication links. The image sensor 760 may be integrated with the processor 710 in one chip, or the image sensor 760 and the processor 710 may be implemented as separate chips.

At least a portion of the mobile system 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). The computing system 700 may be a digital camera, a mobile phone, a smart phone, a portable multimedia player (PMP), a personal digital assistant (PDA), a computer, etc.

Figure 20:
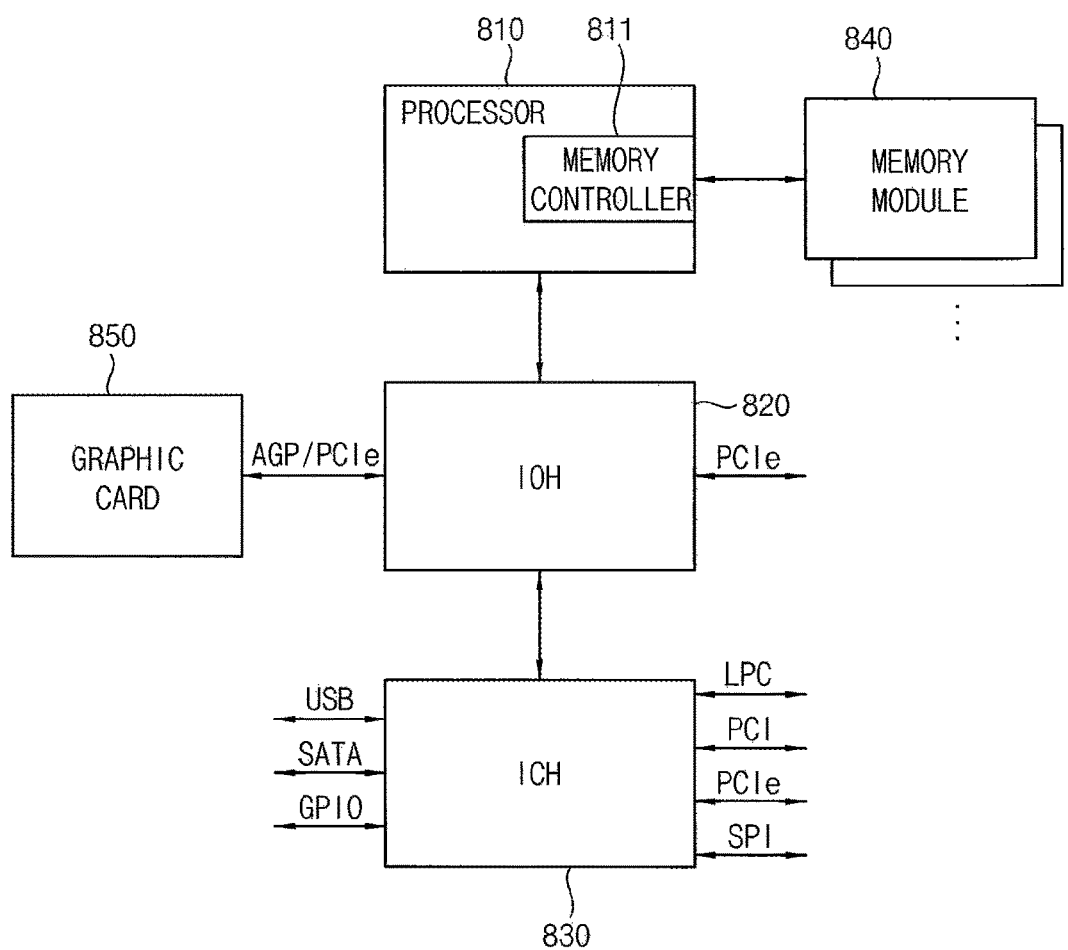
FIG. 20 is a block diagram illustrating a computing system including the nonvolatile memory device according to example embodiments.

FIG. 20 is a block diagram illustrating a computing system including the nonvolatile memory device according to example embodiments.

Referring to FIG. 20, a computing system 800 includes a processor 810, an input/output hub (IOH) 820, an input/output controller hub (ICH) 830, at least one memory module 840 and a graphics card 850. In example embodiments, the computing system 800 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 20 illustrates the computing system 800 including one processor 810, in some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located inside the input/output hub 820, which may be referred to as memory controller hub (MCH).

The memory module 840 may include a plurality of memory devices. Each of the memory devices may be a nonvolatile memory device 10 of FIG. 1.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a Quick-Path interconnect (QPI), a common system interface (CSI), etc. Although FIG. 21 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not illustrated) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In example embodiments, the processor 810, the input/output hub 820 and the input/output controller hub 830 may be implemented as separate chipsets or separate integrated circuits. In example embodiments, at least two of the processor 810, the input/output hub 820 and the input/output controller hub 830 may be implemented as a single chipset.

Nonvolatile memory devices according to example embodiments may be applied to a solid-state drive (SSD).

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A nonvolatile memory device comprising:
a memory cell array including a plurality of planes, each plane configured to receive one of a first ground selection voltage and a second ground selection voltage; and
a voltage generator configured to provide selectively one of the first ground selection voltage and the second ground selection voltage independently to each of the plurality of planes based on a result of an erase verification operation on each of the plurality of planes.

2. The nonvolatile memory device of claim 1, wherein each plane includes at least one NAND string,
each NAND string includes a string selection transistor, a ground selection transistor connected to a ground selection line and a plurality of cell transistors connected in series between the string selection transistor and the ground selection transistor,
the NAND string further includes a dummy transistor connected between a first cell transistor of the cell transistors and the ground selection transistor, and
the voltage generator is configured to selectively provide a dummy gate voltage to a gate of the dummy transistor based on the result of the erase verification operation.

3. The nonvolatile memory device of claim 2, wherein the voltage generator is configured to apply a first dummy gate voltage to at least one erase completion plane of the plurality of planes based on the result of the erase verification operation,
the voltage generator is configured to apply a second dummy gate voltage to at least one erase non-completion plane of the plurality of planes based on the result of the erase verification operation,
the at least one erase completion plane is a plane that passes the erase verification operation, and
the at least one erase non-completion plane is a plane that does not pass the erase verification operation.

4. The nonvolatile memory device of claim 3, wherein the voltage generator is configured to provide the first dummy gate voltage to the at least one erase completion plane using a dummy gate line until a first time when an erase voltage is provided to the memory cell array, and
the dummy gate line is configured to float after the first time.

5. The nonvolatile memory device of claim 3, wherein the voltage generator is configured to provide the second dummy gate voltage to the at least one erase non-completion plane using a dummy gate line until a first time when an erase voltage is provided to the memory cell array, and
the dummy gate line is configured to float after the first time.

6. The nonvolatile memory device of claim 1,
wherein the memory cell array includes a three dimensional memory cell array.

7. A nonvolatile memory device, comprising:
a memory cell array including a plurality of planes, each plane configured to receive one of a first ground selection voltage and a second ground selection voltage; and
a voltage generator configured to provide selectively one of the first ground selection voltage and the second ground selection voltage independently to each of the plurality of planes based on a result of an erase verification operation on each of the plurality of planes, wherein
the voltage generator is configured to apply the first ground selection voltage to at least one erase completion plane of the plurality of planes based on the result of the erase verification operation,
the voltage generator is configured to apply the second ground selection voltage to at least one erase non-completion plane of the plurality of planes based on the result of the erase verification operation,
the at least one erase completion plane is a plane that passes the erase verification operation, and
the at least one erase non-completion plane is a plane that does not pass the erase verification operation.

8. The nonvolatile memory device of claim 7,
wherein the first ground selection voltage is greater than the second ground selection voltage.

9. The nonvolatile memory device of claim 7,
wherein the voltage generator is configured to provide the first ground selection voltage to the at least one erase completion plane until a first time when an erase voltage is provided to the memory cell array.

10. The nonvolatile memory device of claim 9, wherein
the voltage generator is configured to provide the one of the first ground selection voltage and the second ground selection voltage independently to each of the plurality of planes through a ground selection line connected to a floating transistor,
the floating transistor is configured to turn on in response to a floating signal, and
the floating transistor is configured to turn off at the first time.

11. The nonvolatile memory device of claim 10, wherein the ground selection line is configured to float when the floating transistor is turned off after the first time.

12. The nonvolatile memory device of claim 7,
wherein the voltage generator is configured to provide the second ground selection voltage to the at least one erase non-completion plane using a ground selection line until a first time when an erase voltage is provided to the memory cell array, and
the ground voltage selection line is configured to float after the first time.

13. The nonvolatile memory device of claim 7, wherein
the voltage generator is configured to provide the first ground selection voltage to the at least one erase completion plane using a ground selection line from a first time when an erase voltage is provided to the memory cell array to a second time after the first time, and
the ground selection line is configured to float after the second time.

14. The nonvolatile memory device of claim 7, wherein
the voltage generator is configured to provide the second ground selection voltage to the at least one erase non-completion plane using a ground selection line from a first time when an erase voltage is provided to the memory cell array to a second time after the first time, and
the ground selection line is configured to float after the second time.

15. The nonvolatile memory device of claim 7, further comprising:
a control circuit configured to control an erase verification operation performed on each of the plurality of planes and determine a result of the erase verification operation on each of the plurality of planes.

16. A nonvolatile memory device comprising:
a memory block including planes; and
a voltage generator connected to the memory block through ground selection lines,
the voltage generator configured to receive a result of an erase verification operation performed on the planes,
the voltage generator configured to independently apply a first ground selection voltage to a first number of the planes and to apply a second ground selection voltage to a second number of the planes using the ground selection lines during an erase operation performed on the memory block, based on the result of the erase verification operation,
a sum of the first number and the second number corresponding to a total number of the planes in the memory block, and
the first ground selection voltage being different than the second ground selection voltage.

17. The nonvolatile memory device of claim 16, wherein
the first number of the planes are the planes that pass the erase verification operation, the second number of the planes are the planes that do not pass the erase verification operation, and
the first ground selection voltage is greater than the second ground selection voltage.

18. The nonvolatile memory device of claim 17, further comprising:
floating transistors connected to the ground selection lines, wherein
the voltage generator is configured to apply the first voltage to the first number of planes and to apply the second voltage to the second number of planes until a first time during the erase operation if the floating transistors are turned on until the first time, and
the voltage generator is configured to float the ground selection lines connected to the planes if the floating transistors connected to the ground selection lines are turned off during the erase operation.

19. The nonvolatile memory device of claim 16, wherein each of the planes includes NAND strings,
the NAND strings include a plurality of cell transistors stacked on top of each other between a ground selection transistor and a string selection transistor, and
the NAND strings in the first number of planes are erase-inhibited during the erase operation.

20. The nonvolatile memory device of claim 16, wherein
the NAND strings include a dummy transistor connected between the cell transistors and the ground selection transistor,
the voltage generator is connected to the dummy transistors through dummy gate lines,
the voltage generator is configured to apply a first dummy gate voltage to the dummy transistors in the first number of planes and to apply a dummy gate voltage to the dummy transistors in the second number of the planes using the dummy gate lines until a first time during the erase operation, the first dummy gate voltage and the second dummy gate voltage are different compared to each other.

* * * * *